United States Patent [19]
Wei et al.

[11] Patent Number: 5,631,485
[45] Date of Patent: May 20, 1997

[54] ESD AND HOT CARRIER RESISTANT INTEGRATED CIRCUIT STRUCTURE

[75] Inventors: Yi-Hen Wei; Ying T. Loh, both of Saratoga; Chung S. Wang, Fremont; Chenming Hu, Alamo, all of Calif.

[73] Assignee: VLSI Technology, Inc., San Jose, Calif.

[21] Appl. No.: 484,703

[22] Filed: Jun. 6, 1995

Related U.S. Application Data

[62] Division of Ser. No. 394,064, Feb. 24, 1995, and a continuation of Ser. No. 58,749, May 7, 1993.

[51] Int. Cl.$^6$ .......................... H01L 29/76; H01L 29/94
[52] U.S. Cl. .......................... 257/344; 257/327; 257/335; 257/336; 257/337
[58] Field of Search .......................... 257/327, 335, 257/336, 337, 344

[56] References Cited

U.S. PATENT DOCUMENTS

| | | | |
|---|---|---|---|
| 5,217,910 | 6/1993 | Shimizu et al. | 437/35 |
| 5,270,227 | 12/1993 | Kameyama et al. | 437/35 |
| 5,281,557 | 1/1994 | Wu | 437/235 |

FOREIGN PATENT DOCUMENTS

| | | | |
|---|---|---|---|
| 0195607 | 9/1986 | European Pat. Off. | 29/8 |
| 1196176 | 8/1989 | European Pat. Off. | 29/78 |
| 3272145 | 12/1991 | European Pat. Off. | 21/336 |
| 58-243810 | 7/1985 | Japan | 29/78 |
| 4136406A1 | 5/1992 | Netherlands | 21/335 |

OTHER PUBLICATIONS

Hori, Takashi et al., "A New Mosfet with Large–Tilt–Angle Implanted Drain (LATID) Structure," IEEE Electron Device Letters, vol. 9, No. 6, Jun. 1988, pp. 300–302.

Hori, Takashi, "1/4–pm LATID" (LArge–Tilt–angle Implanted Drain)Technology for 3.3–V Operation, IEEE 1989.

Y. Wei et al., "Mosfet Drain Engineering for ESD Performance," EOS/ESD Symposium, pp. 4.3.1–4.3.6., Sep. 16, 1992.

Sabbas Daniel et al., "Process and Design Optimization for Advanced CMOS I/O ESD Protection Devices," EOS/ESD Symposium Proceedings, 1990, pp. 207–213.

D. Duvvury et al. "ESD Phenomena in Graded Junction Devices," Texas Instruments, Inc., pp. 71–76.

*Primary Examiner*—Mahshid D. Saadat
*Assistant Examiner*—Valencia Martin Wallace
*Attorney, Agent, or Firm*—Hickman Beyer & Weaver

[57] ABSTRACT

An integrated circuit device including a substrate, a gate structure formed over the substrate, a channel formed in the substrate under the gate, a lightly-doped drain-side LDD region formed in the substrate adjacent to a drain-side of the channel (preferably by a LATID process), a drain region formed in the substrate near to the drain-side LDD region, and a drain-side DDD region substantially separating the drain-side LDD region from the drain region. Preferably, the integrated circuit device is symmetrically formed such that a lightly-doped source-side LDD region is formed in the substrate adjacent to a source-side of the channel (again preferably by a LATID process), a source region is formed in the substrate near to the source-side LDD region, and a source-side DDD region is formed in the substrate to substantially separate the source-side LDD region from the source region. Further preferably, the DDD regions substantially isolate the source and drain from a bulk portion of the substrate. A method of the present invention includes the steps of providing a semiconductor substrate, forming a gate over the substrate to define a channel, doping the substrate to form a pair of LDD regions in the substrate, doping the region to form a drain region and a source region, and doping the substrate to form a drain-side DDD region in the substrate which substantially separates the drain region from a drain-side LDD region and which substantially isolates the drain region from a bulk portion of the substrate, and to form a source-side DDD region in the substrate which substantially separates the source region from a source-side LDD region and substantially isolates the source region from a bulk portion of the substrate.

17 Claims, 5 Drawing Sheets

Figure 1a (Prior Art LDD Structure)

Figure 1b (Prior Art LATID Structure)

Figure 1c (Prior Art DDD Structure)

ESD AND HOT CARRIER RESISTANT INTEGRATED CIRCUIT STRUCTURE

This is a divisional of copending application U.S. application Ser. No. 08/394,064 filed on Feb. 24, 1995 and continuation applicaion Ser. No. 08/058,749 filed May 7, 1993.

BACKGROUND OF THE INVENTION

This invention relates generally to integrated circuits and, more particularly, to integrated circuit MOSFET devices and methods for their manufacture.

Metal oxide semiconductor field effect transistors (MOSFETS) are basic electronic devices used in many integrated circuits (ICs). MOSFETS are typically formed in a semiconductor substrate by providing a gate structure over the substrate to define a channel region, and by forming source and drain regions on opposing sides of the channel region. A common variant of the basic MOSFET device is known as complementary metal oxide semiconductor (CMOS) device wherein two MOSFETS of opposing polarity types are coupled together to provide a single, functional CMOS transistor device.

An advantage of CMOS devices is that they have very low standby power requirements. Therefore, CMOS devices are well adapted for applications which require low-energy consumption. Furthermore, since CMOS devices consume less power than MOSFET devices or bipolar circuitry, CMOS devices tend to generate less heat than these other technologies, making them well suited for high-density circuitry which might otherwise require elaborate cooling mechanisms.

Integrated circuit designers continue to design integrated circuit devices with smaller and smaller feature sizes. For example, not too long ago it was not uncommon to have MOSFET devices (including CMOS devices) having channel lengths of 2 microns or more. The current state of the art for production MOSFET devices has 0.8 micron channel lengths. The next generation of high-density digital integrated circuitry, however, will be made with MOSFETS having channel lengths of 0.6 microns, and even shorter.

As the channel lengths of MOSFET devices have shrank, MOSFETS have become more susceptible to certain problems. One of these problems is known as the "hot carrier" or "hot electron" effect wherein energetic carriers, typically electrons, are accelerated by high electric (E) fields within the channel and injected into the thin dielectric layer of the gate structure and into the thicker dielectric gate spacer structure. Over time, these hot electrons create a permanent charge in the thin dielectric layer and the dielectric spacers of the gate structure, degrading or destroying the performance of the associated MOSFET device. This is typically more of a problem with N-channel MOSFETS (which have electrons as the primary carrier species) than in P-channel MOSFETS (which have "holes" as the primary carrier species).

Figure 1A:
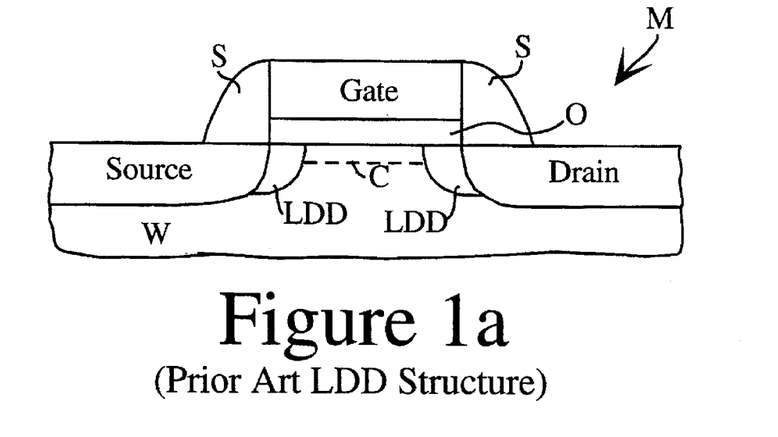
FIG. 1a illustrates a prior art lightly-doped drain (LDD) MOSFET device.

FIG. 1a illustrats prior art lightly doped drain (LDD) MOSET structure which is used to reduce the hot electron effect in MOSFET devices. As in all MOSFET devices, the LDD structure includes a source, a drain, and a gate structure. Theoretically, only the drain requires a lightly doped region to reduce the hot electron effect. However, the LDD structure typically includes two lightly doped regions, one of which is provided proximate to the drain and the other of which is provided proximate to the source for ease of manufacturability. A channel C of the LDD structure extends between the source LDD region and the drain LDD region. By providing the LDD regions, the electric field E proximate to the channel C is reduced, thereby producing fewer "hot electrons" which could be injected into the thin gate dielectric layer O or the spacers S of the gate structure.

The prior art LDD structure of FIG. 1a can be made by a variety of processes, but is typically made by providing a low-density ion implant of the LDD regions before adding oxide spacers S to the gate structure. After the spacers S have been added to the gate structure, a higher-density ion implant is made to form the source and drain regions. A subsequent annealing process is then typically performed to activate the implanted ions. Since the source and drain regions were implanted after the formation of the spacers S, they are offset farther from the center of the channel C than are the LDD regions.

As channel lengths have become shorter, it has become desirable to extend the lightly-doped regions farther into the channel region. A process known as the "large tilt-angle implant drain" (LATID) has been developed to provide a longer lightly doped region (thereby further reducing peak electric field strength) and to shift the peak electric field strength further underneath the gate oxide, thereby reducing injection of electrons into the thicker spacer dielectric. Both of these factors reduce the hot electron effect. The extended lightly-doped regions reduce the hot electron effect, vis-a-vis the LDD MOSFET structure.

Figure 1B:
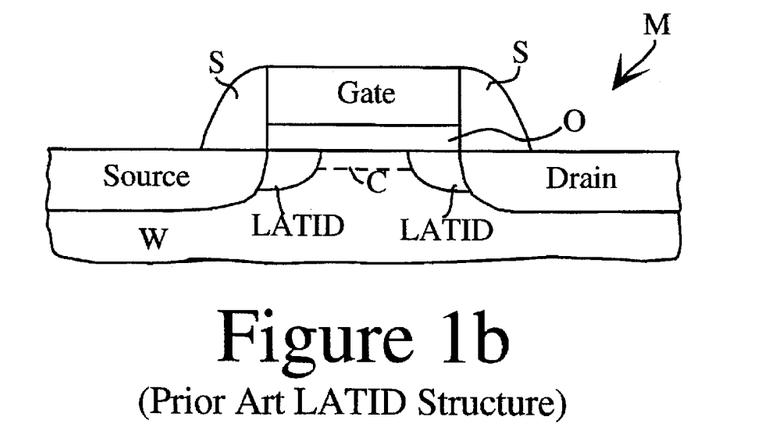
FIG. 1b illustrates a prior art large tilt-angle implanted drain (LATID) MOSFET device.

With reference to FIG. 1b, a prior art LATID process forms the illustrated LATID structure. To create the LATID structure of FIG. 1b, a gate assembly is first formed over a semiconductor substrate W. Next, ions are implanted into the substrate W at an angle to form LATID regions on opposing sides of a channel region C. The angle of the ion implantation for the LATID regions is typically about 20–60 degrees. This forms lightly-doped LATID regions which extend farther beneath the gate assembly of the LATID structure. Next, the spacers S are formed against the gate structure, and source and drain implants take place to create the source and drain regions. Examples of LATID MOSFET structures are described in an article entitled "A New MOSFET with Large-Tilt-Angle Implanted Drain (LATID) Structure," *IEEE Electron Device Letters*, Vol. 9, No. 6, June 1988, by Takashi Hori and Kazumi Kurimoto, and in an article entitled "¼µ LATID Technology for 3.3 V Operation", Takashi Hori, 1989 *IEDM*.

Another problem which is encountered with MOSFET devices, is damage due to electrostatic discharge (ESD). This is particularly true of MOSFET devices used for integrated circuit input/output (I/O). With such I/O MOSFET devices, an electrostatic discharge on a lead of an integrated circuit can a high energy discharge across the I/O device, thereby destroying the device. Both LDD and LATID MOSFET structures are quite vulnerable to ESD.

Figure 1C:
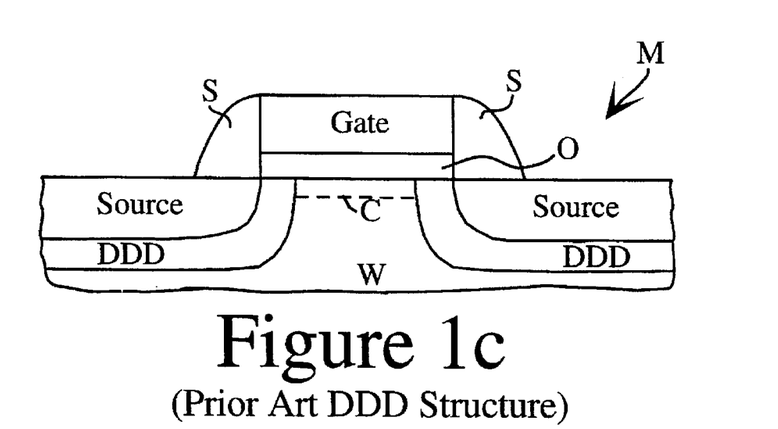
FIG. 1c illustrates a prior art double-diffused drain (DDD) MOSFET device.

FIG. 1c illustrates a prior art double diffused drain (DDD) MOSFET device which has a reduced vulnerability to ESD. The DDD MOSFET device of FIG. 1c involves the formation of medium to heavily doped DDD regions in the substrate W. Unfortunately, while the DDD MOSFET structure of FIG. 1c greatly reduces vulnerability to ESD, it has the undesired side-effect of increasing the hot electron effect and another problem known as the "short channel effect" compared to LDD or LATID MOSFET structures. The short channel effect occurs when the channel is so short that the gate can no longer fully shut off the flow of carriers through the channel region. With the short channel effect, the MOSFET devices tend to have high leakage currents, which increases power consumption and may degrade the functionality of the MOSFET device.

Several papers discussing the DDD structure include "MOSFET Drain Engineering for ESD Performance" by Yi-Hen Wei, 1992 EOS/ESD Symposium, Sept. 16 1992; "ESD Phenomena in a Graded Junction Devices", Duvvury et al, Texas Instruments, Inc., *IEEE/IRPS* 1989; and "Process and Design Optimization for Advanced CMOS I/O ESD Protection Devices," Daniel et al, 1990 EOS/ESD Symposium Proceedings.

SUMMARY OF THE INVENTION

The present invention teaches an integrated circuit structure in the form of a MOSFET device which provides ESD protection while simultaneously reducing the hot electron and short channel effects. The present invention also includes a novel process for manufacturing such a MOSFET device.

An integrated circuit device in accordance with the present invention includes a substrate that is doped with a first polarity type dopant, a gate structure formed over the substrate, a lightly-doped drain-side LDD region of a second polarity type formed in the substrate, a drain region of the second polarity type formed in the substrate near the lightly-doped drain-side LDD region, and a drain-side DDD region of the second polarity type separating the drain-side LDD region from the drain region. Preferably, the drain-side DDD region also substantially isolates the drain region from a bulk portion of the substrate. The described MOSFET device typically also includes a symmetrically located lightly-doped source-side LDD region formed in the substrate, a source region formed in the substrate near to the source-side LDD region, and a source-side DDD region separating the source-side LDD region from the source region. The symmetrically located source-side LDD region is provided for manufacturing convenience, but can be eliminated, if desired, with minimal impact on the reduction of the hot-electron effect.

As used herein, "LDD" is a generic term for several methods of producing lightly doped regions. A conventional LDD process produces the LDD MOSFET structure shown in FIG. 1a. The large tilt-angle implanted drain (LATID) MOSFET structure of FIG. 1b is an alternate method for producing LDD regions. It is this LATID method that is preferred for producing the LDD regions of the present invention.

A method for making an integrated circuit device in accordance with the present invention includes providing a semiconductor substrate that is doped with a first polarity type dopant, forming a gate over the substrate, doping the substrate with a second polarity type opposite to the first polarity type to form a pair of LDD regions in the substrate, doping the substrate with the second polarity type to form a drain region in the substrate next to a drain-side LDD region and to form a source region in the substrate next to a source-side LDD region, and doping the substrate with the second polarity type to form a drain-side DDD region in the substrate which substantially separates the drain region from the drain-side LDD region and to substantially isolate the drain region from a bulk portion of the substrate, and a source-side DDD region in the substrate which substantially separates the source region from the source-side LDD region and to substantially isolate the source region from a bulk portion of the substrate means. Again, preferably, the step of doping the substrate to form the pair of LDD regions comprises a large tilt-angle implanted drain (LATID) type implantation step. The step of doping the substrate to form the drain-side DDD region and the source-side DDD region preferably comprises the step of implanting ions into the substrate, and annealing the substrate to cause the DDD region to substantially enclose the drain and source regions.

An advantage of the structure and process of the present invention is that a MOSFET integrated circuit device is provided with ESD protection almost as good as that provided by the prior art DDD process. Furthermore, the structure and process of the present invention also has very good immunity to the hot electron and short-channel effects and, in fact, is almost as good as the prior art LATID process for reducing vulnerability to these effects. The present invention, therefore, provides excellent protection against ESD, and very good immunity to both the hot electron and short-channel effects.

These and other advantages of the present invention will become apparent upon reading the following detailed descriptions and studying the various figures of the drawings.

DETAILED DESCRIPTION OF THE PREFERRED EMBODIMENTS

FIGS. 1a, 1b, and 1c were discussed in terms of the prior art. FIGS. 2a–2e illustrate process steps for producing a MOSFET device of the present invention.

Figure 2A:
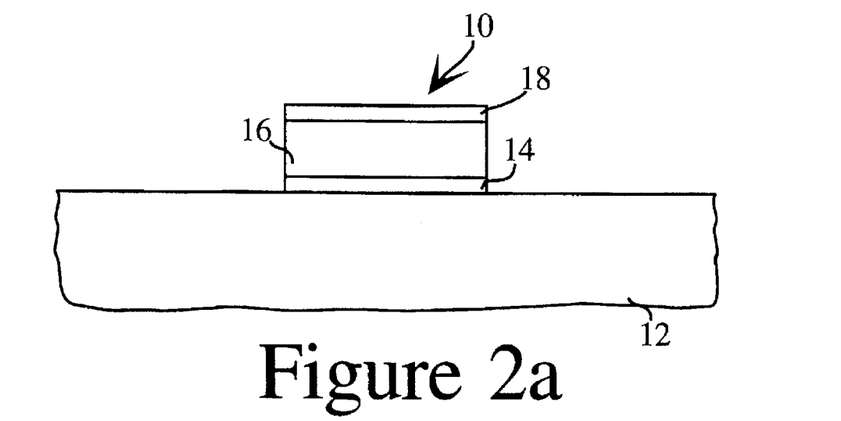
FIGS. 2a–2e illustrate process steps used in the formation of a MOSFET device in accordance with the present invention.

A preferred method for making a MOSFET device in accordance with the present invention begins, in FIG. 2a, with the formation of a gate structure 10 over a semiconductor substrate 12. The semiconductor substrate 12 is preferably a silicon wafer, or the like, and is preferably lightly P doped. As used herein "substrate" does not necessarily refer to the entire silicon wafer, and may refer to only a portion of the wafer which serves as a substrate for the MOSFET device of the present invention. For example, the substrate can be a P-type well provided in a neutral or N-type wafer. A preferred dopant for the lightly P doped substrate 12 is boron. The gate structure 10 of the present invention includes a thin dielectric (preferably a silicon dioxide) layer 14, a polysilicon ("poly") layer 16, and a tungsten silicide (WSi) layer 18. The thin oxide layer 14 can be produced by any suitable process, such as a thermal growth or a chemical vapor deposition (CVD) process, and is preferably about 50–500 angstroms thick. The poly layer 16 is also deposited by a suitable process, such as a CVD process. Finally, the tungsten silicide layer 18 is formed over the poly layer 16 by a suitable process, such as a CVD process. The tungsten silicide layer 18 is provided because it has better conductivity than the polysilicon layer 16 of the gate structure 10. The three layers 14, 16, and 18 preferably patterned by a photolithography process to form the gate structure 10, as is well known to those skilled in the art.

Figure 2B:
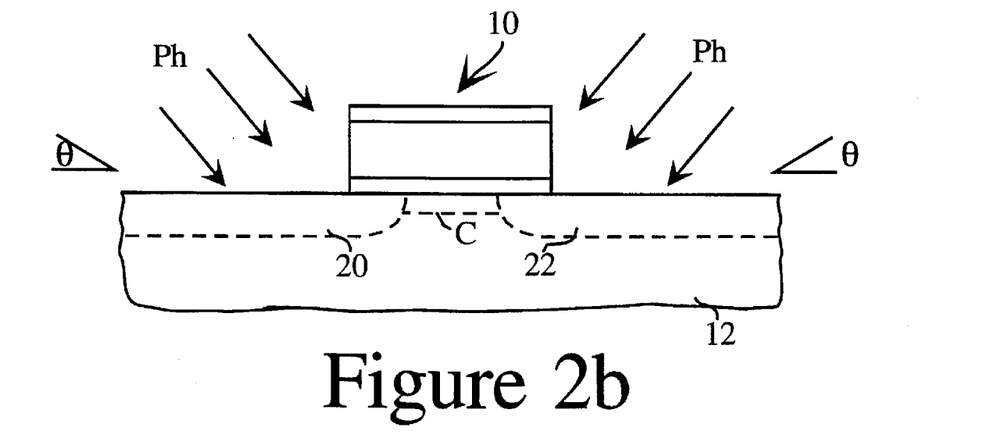

In FIG. 2b, a next step in accordance with the present invention is a large tilt-angle implanted drain (LATID) ion implantation of the substrate 12. A preferred ion implant species for this step is phosphorus (Ph) which will provide a negative (N−) doping of the substrate 12. Preferably, the angle θ at which the phosphorus ions are implanted is in the range of about 20–60 degrees, with about 30 degrees being preferred. A preferred density for this first phosphorus implantation is $1 \times 10^{12}$ to $1 \times 10^{14}$ atoms per $cm^3$, at an implant energy of between 40–90 keV. This LATID implantation will produce LATID regions 20 and 22 between a channel region C located beneath the gate structure 10. For purposes of discussion, the LATID region 20 will be referred to as the source-side LATID region, and the LATID region 22 will be referred to as the drain-side LATID region.

To repeat an earlier definition, as used herein, "LDD" is a generic term for a lightly doped region which can be produced by several different processes. The LATID process is the preferred method for producing the LDD regions of the present invention. It is therefore to be understood the terms "LATID region" and "LDD region" may be used interchangeably herein.

Figure 2C:
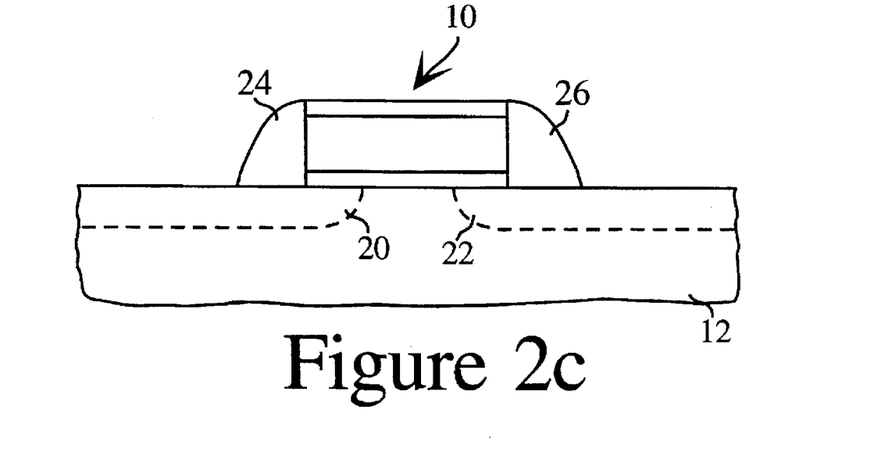

In FIG. 2c, spacers 24 and 26 are added to the gate structure 10. The spacers are preferably formed by a tetra-ethylorthosilicate (TEOS) CVD deposition of silicon dioxide ($SiO_2$) to a depth of approximately 2000–4000 angstroms, followed by a subsequent reactive ion etch (RIE) etch-back which removes the silicon oxide except in the regions in direct contact with the sidewalls of the gate structure 10.

Figure 2D:
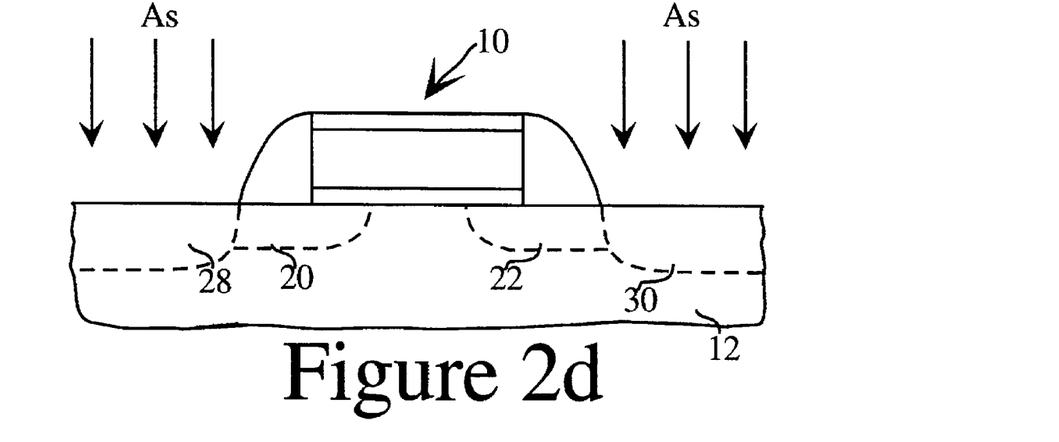

In FIG. 2d a source/drain implant is made to create a source region 28 and a drain region 30. Preferably, the source and drain regions are created with implant of arsenic (As) ions, which are implanted at an angle θ of between 0 and 10 degree with concentration of $10^{15}$–$10^{16}$ atoms per $cm^3$, and with an energy of 40–80 keV. This implant will create an N+ source region 28 and drain region 30, and will completely overwhelm a much more lightly doped N− LATID regions where there is an overlap.

Figure 2E:
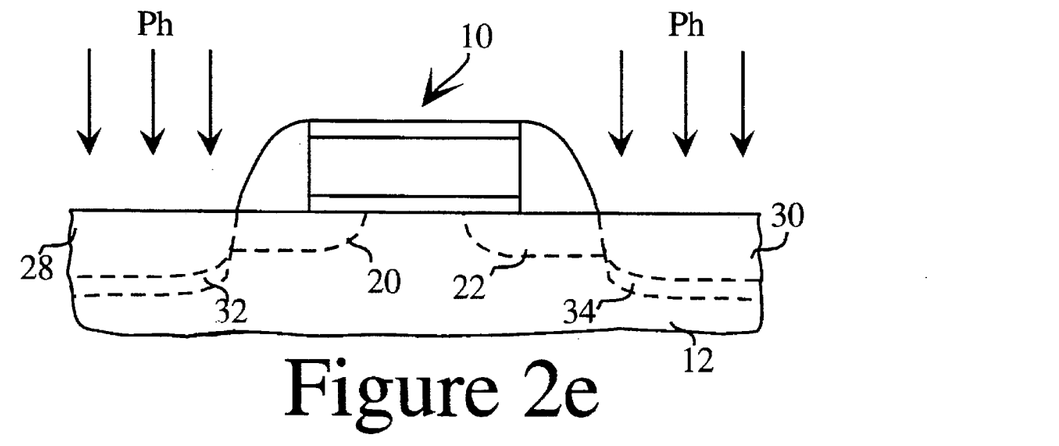

FIG. 2e illustrates the next step in the process of the present invention. In this step, a phosphorus implant creates double-diffused drain (DDD) P-type regions 32 and 34 in the substrate 12. Preferably, the phosphorus ions are implanted at an angle of between 0 and 10 degrees, with a density of $1 \times 10^{14}$–$5 \times 10^{15}$ atoms per $cm^3$, and an implant energy of 50–100 keV. More preferably, the double-diffused drain (DDD) P-type regions 32 and 34 are heavy doped with phosphorus atoms to density of about $4 \times 10^{15}$ atoms per $cm^3$. In this embodiment, the implant energy is about 50 keV. To assure that the profile of the previously implant LDD regions are adequately overwhelmed and the resulting has a deep junction. The DDD region 32 next to the source 28 will be referred to herein as the source DDD region, and the DDD region 34 next to the drain 30 will be referred to herein as the drain DDD region. This DDD phosphorus implant does not overwhelm the source and drain implants of the previous step.

Figure 3:
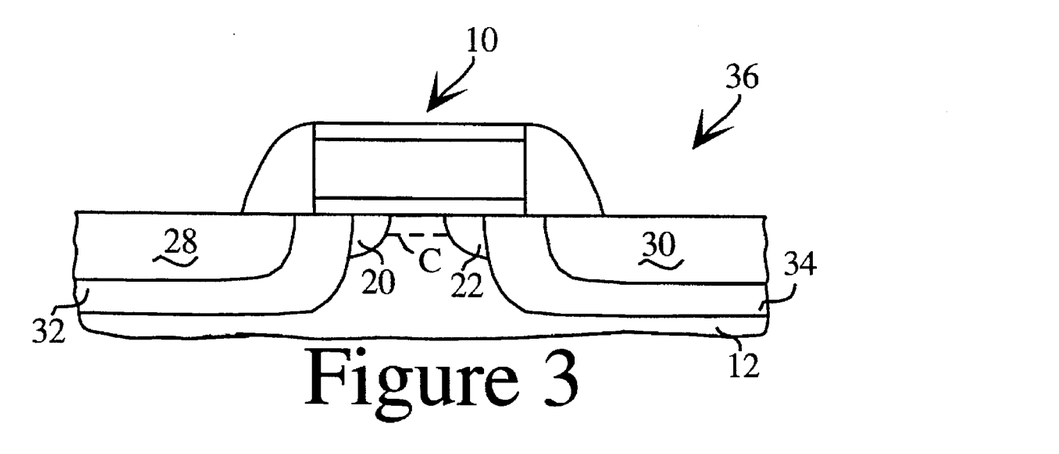
FIG. 3 illustrates a MOSFET device of the present invention.

A final step in accordance with the present invention is to anneal the structure illustrated in FIG. 2e to create the structure shown in FIG. 3. The structure of FIG. 2e is preferably annealed in a high-temperature annealer at a temperature of between 800° C. and 1000° C. for a period of approximately 0.1–1.0 hrs. A preferred annealing temperature is 900° C. and a preferred annealing time is approximately 30 minutes. However, it is important not to over-anneal, because over-annealing can drive the DDD regions too deeply into the LATID regions and thereby overwhelm the LATID regions. This would increase the susceptibility of the structure to the hot electron effect.

FIG. 3 illustrates a MOSFET structure 36 in accordance with the present invention. As can be seen, the annealing process performed on the structure illustrated in FIG. 2e causes the drain DDD region 34 to extend between the LATID region 22 and the drain region 30 and to substantially isolate the drain region 30 from the bulk portion of substrate 12. Similarly, the source DDD region 32 is caused by the annealing process to extend between the source region 28 and the lightly-doped LATID region 20 and to substantially isolate the source region 28 from the bulk portion of substrate 12. In addition to causing the phosphorus ions in the DDD regions to migrate as illustrated in FIG. 3, the annealing step also "activates" the ions of the implant, as will be appreciated by those skilled in the art.

The MOSFET structure 36 is an n-channel MOSFET and, when paired with a p-channel MOSFET of similar design, can form a CMOS transistor having ESD protection and reduced vulnerability to the hot electron and short-channel effects.

The MOSFET device 36 of FIG. 3 differs from the prior art DDD MOSFET device of FIG. 1c in a very significant way. The MOSFET device 36 of the present invention provides the extended lightly-doped regions 20 and 22 which result in the reduced sensitivity to the hot electron and short-channel effects The prior art DDD structure does not have these lightly-doped areas. In fact, some prior art DDD processes incorporated LDD regions by the conventional process illustrated in FIG. 1a as an intermediate step (for manufacturing convenience when they were producing LDD regions for other MOSFETS) and then intentionally completely overwhelmed these LDD regions with subsequent DDD implantations to produce the structure of FIG. 1c without LDD regions. This is because, in the prior art, it was thought that having LDD regions would destroy the ESD protection afforded by the DDD regions. It was the discovery of the present invention that, contrary to the popular wisdom, the LATID regions of the present invention had only a small degradation on ESD protection while improving carrier lifetime by about two orders of magnitude.

Since the present invention requires the lightly-doped regions 20 and 22 to extend beyond the DDD regions 32 and 34, the LATID method for producing a lightly-doped region is preferred over the prior art LDD method. The LATID process is able to implant ions substantially farther beneath a gate structure 10 than the LDD process of the prior art. Since the LATID process can produce lightly-doped region much farther under the gate structure 10, it is possible to produce DDD regions without overwhelming the entirety of the LATD regions 20 and 22.

Figure 4:
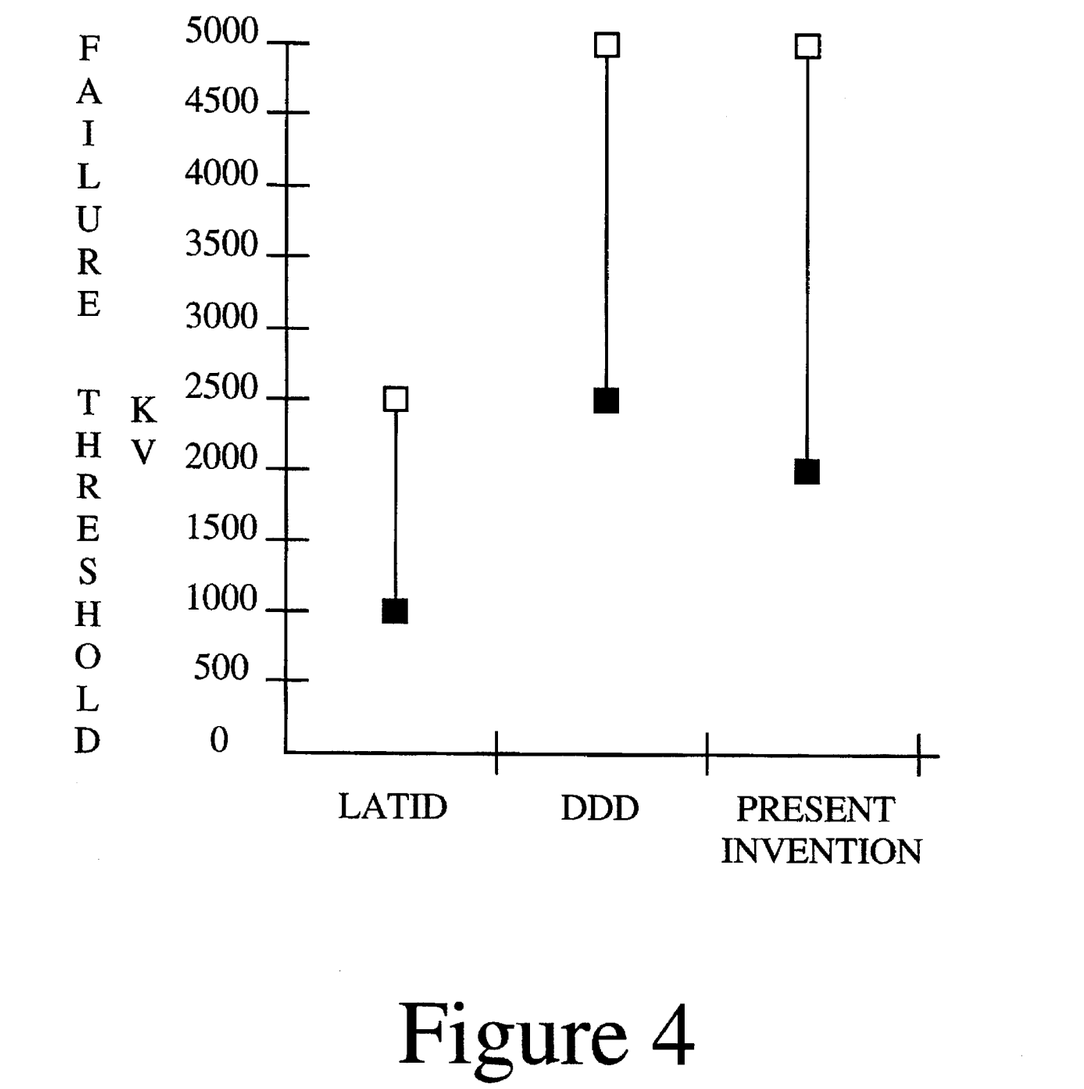
FIG. 4 is a graph illustrating ESD failure thresholds for a LATID MOSFET device, a DDD MOSFET device and the MOSFET device of the present invention.

In FIG. 4, the electrostatic discharge (ESD) failure threshold for several MOSFET structures is illustrated. As can be seen, the LATID device of FIG. 1b is relatively susceptible to ESD failure, and will fail with an ESD in the range of about 1,000–2,500 kV for Human Body Model (HBM) ESD testing. The DDD structure of FIG. 1c is much more immune to ESD failure. In the present tests, the DDD structure of FIG. 1c failed with an ESD in the range of 2,500–5,000 kV. The MOSFET of the present invention has ESD protection comparable to the DDD structure of FIG. 1c. MOSFET devices built in accordance with the process and structure of the present invention failed when subjected to an ESD of between 2,000 and 5,000 kV. It is, therefore apparent that the MOSFET structure 36 of the present invention provides excellent ESD protection.

Figure 5:
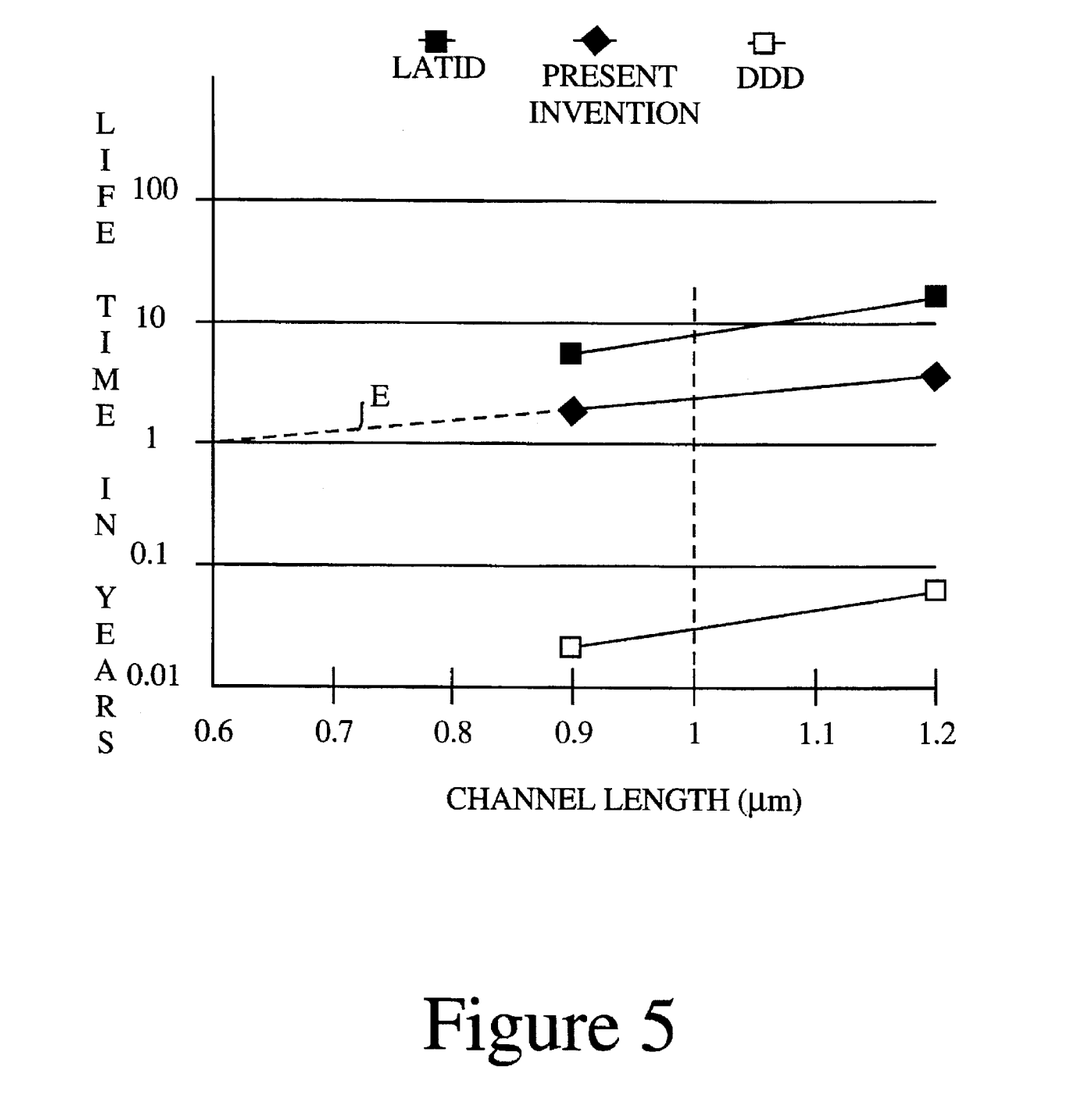
FIG. 5 is a graph illustrating the impact of drain structures on hot electron lifetime for LATID MOSFET devices, DDD MOSFET devices, and MOSFET devices of the present invention.

FIG. 5 illustrates the impact of various drain structures on the hot electron lifetime period. The lifetime of the devices are plotted along the vertical axis of the graph and the channel lengths of the devices are plotted along the horizontal axis. As can be seen in this graph of FIG. 5, the LATID MOSFET structure of FIG. 1b provides an approximately 8-year lifetime if it has a 1 micron channel length. In contrast, the DDD MOSFET structure of FIG. 1c has only about a 0.03 year lifetime period if it has a 1 micron channel length. The hot electron lifetime of the present invention for a 1 micron channel length has about a 3-year life span. Of course, electron life span refers to total cumulative use, and not calendar years existence of the MOSFET device.

An analysis of the graph of FIG. 5 indicates that the DDD MOSFET structure, as it is presently known, is unsuitable for most commercial applications. The hot electron lifetime is simply too short to make it a practical device. On the other hand, both the LATID MOSFET structure of FIG. 1b and the device 36 of the present invention (FIG. 3) provide more than adequate hot electron lifetimes for most commercial purposes. Furthermore, an extrapolation E of the hot electron lifetime for the structure 36 of the present invention indicates a slightly greater than 1-year hot electron lifetime even at a 0.6 micron channel length. Hot electron lifetimes of 1 year is considered sufficient for test commercial purposes. Therefore, the device 36 of the present invention is well suited to MOSFET channel lengths of 0.6 microns and below.

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. An integrated circuit device comprising:

a substrate doped with a first polarity type;

a gate formed over said substrate said gate including a gate oxide, a polysilicon layer and a gate conductor;

a channel region defined in said substrate in proximity to said gate, said channel having a source side and a drain side;

a lightly doped drain side LDD region of a second polarity type formed in said substrate adjacent to said drain side of said channel;

a drain region of said second polarity type formed in said substrate in proximity to said drain side LDD region;

an implanted and annealed drain side DDD region of said second polarity type, said drain side DDD being relatively more heavily doped than said drain side LDD region, said drain side DDD region substantially separating said drain side LDD region from said drain region, said drain side DDD region further substantially isolates said drain region from a bulk portion of said substrate, where said DDD region is doped such that there are more than about $1 \times 10^{14}$ and up to about $5 \times 10^{15}$ atoms per cubic centimeter;

dielectric spacers formed against said drain side and said source side of said gate, and in direct contact with said substrate; and wherein said implanted and annealed drain side DDD region is diffused to a greater extent into the substrate by performing thermal annealing after ion implantation when forming said implanted and annealed drain side DDD region.

2. An integrated circuit device as recited in claim 1 further comprising:

a lightly doped source side LDD region of said second polarity type formed in said substrate adjacent to said source side of said channel;

a source region of said second polarity type formed in said substrate in proximity to said source side LDD region; and an implanted and annealed source side DDD region of said second polarity type, said source side DDD being relatively more heavily doped than said source side LDD region, said implanted and annealed source side DDD region substantially separating said source side LDD region from said source region.

3. An integrated circuit device as recited in claim 2 wherein said implanted and annealed drain side DDD region further isolates said drain region from a bulk potion of said substrate, and wherein said implanted and annealed source side DDD region further isolates said source region from a bulk portion of said substrate.

4. An integrated circuit device as recited in claim 3 wherein said first polarity type is P, and wherein said second polarity type is N.

5. An integrated circuit device as recited in claim 4, wherein a doping species for the first polarity type is boron, and wherein a doping species for the second polarity type is selected from the group consisting essentially of arsenic and phosphorous.

6. An integrated circuit device as recited in claim 5 wherein said LDD regions are doped at about $1 \times 10^{12}$ to $1 \times 10^{14}$ atoms per cubic centimeter, said source region and said drain region are doped at about $1 \times 10^{15}$ to $1 \times 10^{16}$ atoms per cubic centimeter, and said implanted and annealed DDD regions are doped to about $1 \times 10^{14}$ to $5 \times 10^{15}$ atoms per cubic centimeter.

7. An integrated circuit device as recited in claim 6 wherein said channel is less than about 1.0 microns in length.

8. An integrated circuit device having hot carrier and ESD protection comprising:

a substrate doped with a first polarity type;

a gate formed over said substrate, said gate including a gate oxide, a polysilicon layer and a gate conductor;

a channel region defined in said substrate in proximity to said gate, said channel having a source side and a drain side;

a lightly doped drain side LDD and lightly doped source side LDD region of a second polarity type formed in said substrate adjacent to said drain side and source side respectively of said channel;

a drain region of said second polarity type formed in said substrate in proximity to said drain side LDD region and a source region of said second polarity type formed in said substrate in proximity to said source side LDD region;

an implanted and annealed drain side DDD region and an implanted and annealed source side DDD region of said second polarity type, said implanted and annealed drain side DDD and said implanted and annealed source side DDD being relatively more heavily doped than said drain side LDD region and said source side LDD region, said implanted and annealed drain side DDD region and said implanted and annealed source side DDD region substantially separating said drain and source side LDD region from said drain and source region respectively, and said implanted and annealed drain side DDD region and said implanted and annealed source side DDD region further substantially isolates said drain region and said source region from a bulk portion of said substrate, where said implanted and annealed DDD regions are doped to about $5\times10^{15}$ atoms per cubic centimeter;

dielectric spacers formed against said drain side and said source side of said gate, and in direct contact with said substrate; and wherein said implanted and annealed DDD regions are diffused to a greater extent into the substrate by performing thermal annealing after ion implantation when forming said implanted and annealed DDD regions.

9. An integrated circuit device as recited in claim 8, wherein said first polarity type is P, and wherein said second polarity type is N.

10. An integrated circuit device as recited in claim 9, wherein a doping species for the first polarity type is boron, and wherein a doping species for the second polarity type is selected from the group consisting essentially of arsenic and phosphorous.

11. An integrated circuit device as recited in claim 10, wherein said LDD regions are doped at about $1\times10^{12}$ to $1\times10^{14}$ atoms per cubic centimeter, said source region and said drain region are doped at about $1\times10^{15}$ to $1\times10^{16}$ atoms per cubic centimeter.

12. An integrated circuit device as recited in claim 11, wherein said channel is less than about 1.0 microns in length.

13. An integrated circuit device as recited in claim 1, wherein said thermal annealing comprises heating said substrate to between about 800° C. and 1000° C. for about 0.25 to about 2 hours.

14. An integrated circuit device comprising:

a semiconductor substrate of a first polarity type and having a substantially planar substrate surface;

a gate over said substrate surface, and a channel defined in said substrate having a source side and a drain side;

a pair of LDD regions of a second polarity type defined in said substrate by implanting ions into said substrate at an angle between about 20° and 60° with respect to said substrate surface, where a drain side LDD region is adjacent to said drain side of said channel, and where a source side LDD region is adjacent to said source side of said channel;

dielectric spacers defined over said substrate surface on said drain side of said gate sidewall and on said source side of said gate sidewall;

a drain region of said second polarity type defined in said substrate having a higher doping level than that of said drain side LDD and a source region of said second polarity type having a higher doping level than that of the source side LDD, said drain side LDD and said source side LDD defined by implanting ions into said substrate at an angle between about 80° and 90° with respect to said substrate surface;

drain and source side DDD regions defined in said substrate by implanting ions at an angle between about 80° and 90° with respect to said substrate surface, said DDD regions are doped to at least about $1\times10^{14}$ atoms per cubic centimeter; and whereby annealing the substrate to cause migration of the implanted ions such that said drain and source side DDD regions substantially enclose said respective drain and source regions from said semiconductor substrate, said DDD regions acting further to separate said drain and source regions from said respective drain and source side LDD regions.

15. An integrated circuit device as recited in claim 14, wherein said annealing comprises heating said substrate to between about 800° C. and 1000° C. for about 0.25 to about 2 hours.

16. An integrated circuit device comprising:

a substrate doped with a first polarity type;

a gate formed over said substrate said gate including a gate oxide, a polysilicon layer and a gate conductor;

a channel region defined in said substrate in proximity to said gate, said channel having a source side and a drain side;

a lightly doped drain side LDD region of a second polarity type formed in said substrate adjacent to said drain side of said channel;

a drain region of said second polarity type formed in said substrate in proximity to said drain side LDD region;

a drain side DDD region of said second polarity type, said drain side DDD being relatively more heavily doped than said drain side LDD region, said drain side DDD region substantially separating said drain side LDD region from said drain region, said drain side DDD region further substantially isolates said drain region from a bulk portion of said substrate, said DDD regions are doped to at least about $1\times10^{14}$ atoms per cubic centimeter;

dielectric spacers formed against said drain side and said source side of said gate; and whereby said drain side DDD region is diffused to a greater extent into the substrate.

17. An integrated circuit device as recited in claim 16, wherein said DDD regions are doped to a concentration of about $4\times10^{15}$ atoms per cubic centimeter.

* * * * *